MANUFACTURE OF SEMICONDUCTOR SOLAR CELLS

Filed Aug. 24, 1965

INVENTORS
Krishan S. Tarneja
Fred G. Ernick and Vito A. Rossi
BY [signature]
ATTORNEY

United States Patent Office 3,460,240
Patented Aug. 12, 1969

3,460,240

MANUFACTURE OF SEMICONDUCTOR SOLAR CELLS

Krishan S. Tarneja, Pittsburgh, and Fred G. Ernick and Vito A. Rossi, Greensburg, Pa., assignors to Westinghouse Electric Corporation, Pittsburgh, Pa., a corporation of Pennsylvania Filed Aug. 24, 1965, Ser. No. 482,161
Int. Cl. H01c *7/08;* H01l *15/02*
U.S. Cl. 29—572 6 Claims

ABSTRACT OF THE DISCLOSURE

This disclosure relates to a method of manufacturing a solar cell which comprises growing layers of a semiconductor material on a foreign substrate.

This invention relates to improvements in semiconductor solar cells, and more particularly to a new and improved method for fabricating semiconductor solar cells.

As is known, semiconductor solar cells (i.e., photovoltaic energy converters) are usually manufactured by starting with a silicon wafer which was doped while it was being grown to make it either P-type or N-type, but usually P-type. One face of this wafer is exposed to a vaporized dopant of the opposite conductivity type which diffuses into the semiconductor wafer to a depth of about half a micron and in sufficient quantity to overpower the original doping and change a layer of the material to the opposite type. The result is a piece of silicon with a P-N junction about half a micron below the surface of one face. Light falling on the doped surface of the wafer is absorbed rapidly as it penetrates the silicon, the light energy causing the crystal to become biased with the P-type region positive and the N-type region negative. This bias causes a useful current to flow when the two regions are connected by a conductor.

In a seminconductor solar cell of the type described above, the doped side of the silicon wafer which is exposed to light is in contact with an electrical conducting grid which will permit light to pass therethrough and onto the surface of the wafer. The other side of the wafer is usually coated with a layer of solder, the grid on one side and the solder on the other forming the two terminals for the solar cell.

For the cells to be used as photoelectric power supplies for space applications, it is necessary to provide a protective quartz cover for the side of the cell having the grid thereon and which is exposed to light. Heretofore, most solar cells have been manufactured by starting with a semiconductor wafer which is initially subjected to a diffusion process to form the P-N junction. Thereafter, the grid and bottom contact are applied; and, finally, a quartz cover is placed over the grid and secured to the cell by means of an adhesive cement. The use of such cement, however, is not altogether satisfactory because of fabrication difficulties and because of the weight and reflective characteristics of the adhesive. That is, the adhesive introduces additional reflecting interfaces and problems in matching its index of refraction for reflective losses.

As an overall object, the present invention seeks to provide a new and improved method for fabricating semiconductor solar cells in which the necessity for an adhesive between the quartz cover and the cell is dispensed with, thereby eliminating problems caused by the weight and reflective characteristics of the adhesive.

Another object of the invention is to provide a method for fabricating semiconductor solar cells wherein the starting materials for the cell is a quartz plate, successive layers of N-type and P-type silicon being grown on the plate by epitaxial growth and evaporation techniques.

Another object of the invention is to provide a method for fabricating semiconductor solar cells wherein a major portion of the fabrication steps can be carried on in a single furnace, thereby lowering the cost of the process.

Another object of the invention is to provide a method for producing semiconductor solar cells wherein thin structures on the order of as little as 5–10 mils thickness can be produced as compared to prior-art constructions utilizing silicon wafers wherein the thickness is in the range of 10 to 15 mils. As will be understood, this materially decreases the weight of the cell which is a vital factor in the design of any solar cell intended for use in space applications.

Still another object of the invention is to provide a new and improved solar cell having better radiation resistance than prior-art cells of this type.

In accordance with the invention, the starting material for the solar cell is a quartz plate rather than a silicon wafer as in conventional prior-art techniques. A highly doped, N-type epitaxial layer is then deposited directly on the quartz plate and bonded thereto to provide the N-type layer for the solar cell. In order to make the solar cell more resistant to radiation damage, a P-type graded layer is thereafter deposited epitaxially on the previously-deposited N-type layer, followed by deposition of a P-type epitaxial deposit of low resistivity. The upper grid pattern providing one of the contacts for the cell may be deposited through etched openings in the original quartz plate; and the lower surface of the completed cell covered with aluminum or some other suitable conducting material by evaporation techniques. Alternatively, the grid pattern can be deposited on the underside of the quartz plate prior to epitaxial deposition of the N-type and P-type layers; but in this latter case care must be taken to provide a grid structure formed from a metal which will not melt at the epitaxial reaction temperatures.

The above and other objects and features of the invention will become apparent from the following detailed description taken in connection with the accompanying drawings which form a part of this specification, and in which.

Figure 1:
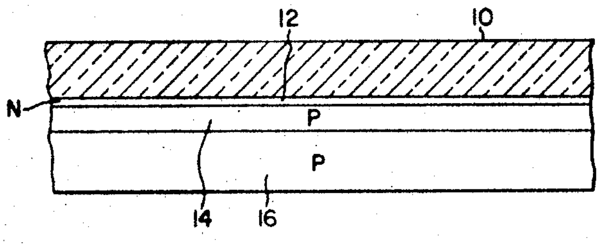
FIGURE 1 is a cross-sectional view of a solar cell fabricated in accordance with the teachings of the present invention, but before the grid structure and lower contact are secured thereto.
Figure 4:
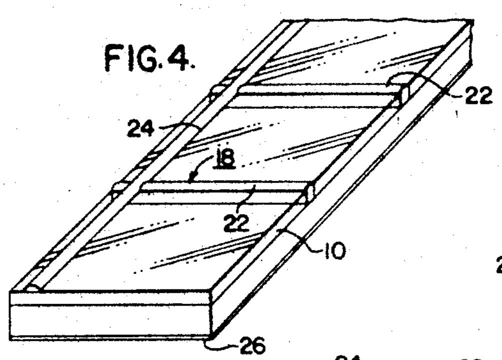
Figure 6:
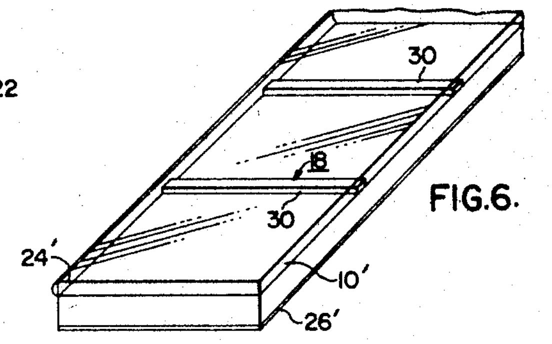
Figure 3:
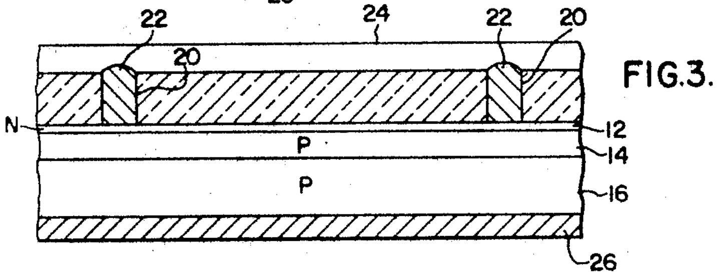
Figure 5:
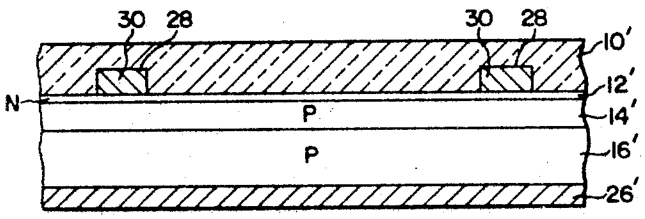

FIGS. 3 and 4 are cross-sectional and isometric views, respectively, of the solar cell construction shown in FIG. 1, but with the grid structure and lower contact formed thereon; and FIGS. 5 and 6 are cross-sectional and isometric views, respectively, of another embodiment of the invention wherein the grid structure is formed on the underside of a quartz plate prior to epitaxial deposition of N-type and P-type silicon layers.

With reference now to the drawings, and particularly to FIG. 1, the starting material in the formation of the solar cell according to the invention is a quartz plate 10 having a thickness of about 3 to 60 mils, 20 mils being a representative figure. A highly-doped N-type epitaxial layer 12 is now deposited on the underside of the quartz plate 10. This layer 12 is preferably about 0.5 to 1 micron thick and is formed in an epitaxial furnace wherein the quartz plate 10 is heated to a temperature of about 1000° C. in the presence of a mixture of gases comprising silicon tetrachloride, hydrogen and phosphine ($PH_3$). At the reaction temperature of about 1000° C. or higher, the silicon tetrachloride and the phosphine react with the hydrogen to form the single silicon crystal layer 12 doped with phosphorus. In this reaction HCl is also formed, and passes off as a gas.

Following formation of the N-type silicon layer 12, and while the quartz plate 10 and layer 12 are in the same epitaxial furnace, a mixture of silicon tetrachloride, hydrogen and gaseous diborane ($B_2H_6$) are introduced into the furnace. In this process, a 25 to 30 micron P-type silicon layer 14 having a graded resistivity is formed on the previously-formed layer 12. Finally, a third P-type silicon layer 16, 2 to 30 mils thick, of lower resistivity is formed on the layer 14, the resistivity of layer 16 being in the range of about 0.001 ohm-centimeter. This last step also takes place in the same epitaxial furnace.

Figure 2:
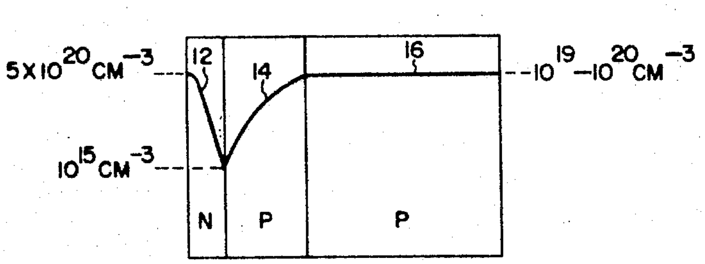
FIG. 2 is an illustration of the dopant concentration profile of the structure shown in FIG. 1.

The final concentration profile of the structure is shown in FIG. 2; and it will be noted that it comprises a profile for silicon solar cells wherein the concentration of the N-type and P-type dopants is at a minimum at the junction between layer 12 and 14.

In order to form the completed solar cell, it is necessary to provide the upper surface of layer 12 with an electrical conducting grid which will permit light to pass therethrough and onto the surface of layer 12. As shown in FIGS. 3 and 4, the grid 18 may be formed by etching slots 20 into the quartz plate 10 such that the slots extend down to the surface of layer 12. These slots are then filled by metallic evaporation techniques with an electrical conducting material, such as silver, to form transverse stringers 22. The stringers 22, in turn, are connected to a common bus 24, also formed from silver, which extends along the long transverse dimension of the solar cell. As will be understood, elements 22 and 24 may be formed by placing a metallic mask over the upper surface of plate 10, the mask having openings at the locations of elements 22 and 24 such that the silver or other suitable material may be evaporated through the openings. The bus 24 then comprises the negative terminal for the cell. The positive terminal for the cell is formed in accordance with conventional techniques by evaporating or otherwise suitably depositing a layer 26 of aluminum or other suitable conducting material on the lower surface of layer 16.

In FIGS. 5 and 6, another embodiment of the invention is shown wherein elements corresponding to those in FIGS. 1, 3 and 4 are identified by like primed reference numerals. In this case, slots 28 are initially etched in the underside of a quartz plate 10' and are filled with electrical conducting material 30 prior to the epitaxial deposition of layers 12', 14' and 16'. Since, however, the minimum epitaxial reaction temperature is 1000° C., a metal other than silver must be employed for the grid structure 18'. This metal preferably comprises titanium coated with manganese, the titanium reacting with the silicon dioxide (i.e., quartz) plate 10' to form a bond of titanium dioxide. The bus 24' may be applied to the edge of the quartz plate 10' after epitaxial deposition of layers 12', 14' and 16', in which case it may comprise silver or some other metal which melts at a temperature beneath 1000° C. Alternatively, it may be formed prior to the epitaxial deposition steps, assuming that it is formed from the same type of material as the stringers 30. Deposition of the lower contact 26' is the same as in connection with the embodiment of FIGS. 1, 3 and 4. The contact material 30 may also be deposited on a planar surface, i.e., the slots 28 are not essential.

The present invention thus provides a method for fabricating semiconductor solar cells wherein the starting material is a quartz plate, rather than a silicon or other semiconductor web. Since silicon will bond to the underside of the quartz plate by epitaxial deposition techniques, the necessity for an adhesive between the quartz plate and the semiconductor material is eliminated along with its attending weight and undesirable reflective characteristics.

It will be appreciated that other foreign substrates (i.e. nonsemiconductors) other than quartz may be employed as the starting material so long as epitaxial semiconductor material may be deposited thereon.

While the invention has been shown in connection with certain specific examples, it will be readily apparent to those skilled in the art that various changes may be made to suit requirements without departing from the spirit and scope of the invention.

We claim as our invention:

1. In the manufacture of semiconductor solar cells, the steps of depositioning a monocrystalline N-type layer of semiconductor material on one side of a quartz plate, thereafter epitaxially depositioning a graded P-type layer of semiconductor material on the previously-formed N-type layer, and finally epitaxially depositioning a P-type layer of semiconductor material of low resistivity on the previously-formed P-type layer.

2. In the manufacture of semiconductor solar cells, the steps of depositing a monocrystalline N-type layer of about 0.5 to 1 micron thickness on one side of a quartz plate, the quartz plate having a thickness in the range of about 3 to 60 mils, thereafter epitaxially depositing a graded P-type layer of semiconductor material of about 25 to 30 microns thickness on the previously-formed N-type layer, and finally epitaxially depositing a P-type layer of semiconductor material of low resistivity on the previously-formed P-type layer, the thickness of said last-mentioned layer of P-type semiconductor material having a thickness in the range of about 2 to 30 mils.

3. In the manufacture of semiconductor solar cells, the steps of depositing a monocrystalline layer of semiconductor material of one conductivity type on one side of a quartz plate, epitaxially depositing a layer of semiconductor material of the opposite conductivity type on the previously-formed layer, etching slots in said quartz plate to expose at said slots the surface of said layer of semiconductor material of one conductivity type, depositing an electrically conducting material into said slots, and forming an elongated metallic bus electrically interconnecting the metal stringers thus formed in said slots.

4. The method of claim 3 and including the step of depositing a layer of electrically conducting material on the exposed surface of said layer of semiconductor material of the opposite conductivity type.

5. In the manufacture of semiconductor solar cells, the steps of evaporating a grid pattern of electrically conducting material on one side of a quartz plate, depositing a monocrystalline layer of semiconductor material of one conductivity type on said one side of the quartz plate after the grid pattern has been formed thereon, and epitaxially depositing a layer of semiconductor material of the opposite conductivity type on the previously-formed layer of said one conductivity type.

6. The method of claim 5 wherein the grid pattern is formed by initially evaporating titanium onto said one side of the quartz plate, followed by evaporation of magnesium onto the previously-formed grid pattern.

References Cited

UNITED STATES PATENTS

| | | | |
|---|---|---|---|
| 2,766,144 | 10/1956 | Lidow. | |
| 3,151,379 | 10/1964 | Escoffery | 29—572 |
| 3,160,522 | 12/1964 | Heywang et al. | 117—93.3 |
| 3,171,761 | 3/1965 | Marinace | 148—175 |
| 3,326,729 | 6/1967 | Sigler | 148—175 |

WILLIAM I. BROOKS, Primary Examiner

U.S. Cl. X.R.

29—589; 136—89; 148—115